(12) United States Patent
Lee et al.

(10) Patent No.: US 7,029,257 B2
(45) Date of Patent: Apr. 18, 2006

(54) APPARATUS AND METHOD FOR MOLDING SIMULTANEOUSLY A PLURALITY OF SEMICONDUCTOR DEVICES

(75) Inventors: Sung-soo Lee, Cheonan (KR); Dae-sung Lee, Asan (KR); Kyung-soo Park, Cheonan (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 332 days.

(21) Appl. No.: 10/298,033

(22) Filed: Nov. 15, 2002

(65) Prior Publication Data

US 2003/0209817 A1 Nov. 13, 2003

(30) Foreign Application Priority Data

May 7, 2002 (KR) ................ 2002-25135

(51) Int. Cl.
*B29C 45/14* (2006.01)
*B29C 45/53* (2006.01)
*B29C 45/76* (2006.01)

(52) U.S. Cl. .............. 425/116; 425/120; 425/129.1; 425/136; 425/169; 425/170; 425/544; 425/DIG. 228

(58) Field of Classification Search ................ 425/116, 425/120, 129.1, 136, 151, 169, 170, 544, 425/DIG. 228
See application file for complete search history.

(56) References Cited

U.S. PATENT DOCUMENTS

| | | | | | |
|---|---|---|---|---|---|
| 3,278,992 | A | * | 10/1966 | Strauss ................. | 425/136 |
| 4,386,898 | A | * | 6/1983 | Sera ..................... | 425/544 |
| 4,426,341 | A | * | 1/1984 | Tsuzuku et al. ........ | 425/170 |
| 4,511,317 | A | * | 4/1985 | Bandoh ................ | 425/544 |
| 4,632,653 | A | * | 12/1986 | Plocher ............... | 425/129.1 |
| 4,723,899 | A | * | 2/1988 | Osada .................. | 425/544 |
| 4,954,301 | A | * | 9/1990 | Saeki et al. ........... | 425/145 |
| 5,158,780 | A | * | 10/1992 | Schraven et al. ...... | 425/DIG. 228 |
| 5,851,559 | A | * | 12/1998 | Scribner et al. ........ | 425/544 |

FOREIGN PATENT DOCUMENTS

| | | | |
|---|---|---|---|
| JP | 60234332 A | * | 11/1985 |
| JP | 01103417 A | * | 4/1989 |
| JP | 06166047 A | * | 6/1994 |
| JP | 06198689 A | * | 7/1994 |

OTHER PUBLICATIONS

Korean Utility Model Abstract, "Apparatus for Molding Semiconductor Package", Publication No. P1998-067601. published Dec. 5, 1998: Application No. 1997-012186, application date: May 28, 1997 (Abstract in English).

* cited by examiner

*Primary Examiner*—Robert B. Davis
(74) *Attorney, Agent, or Firm*—F. Chau & Associates, LLC

(57) ABSTRACT

Provided is a molding apparatus for molding simultaneously a plurality of semiconductor devices. The molding apparatus includes a mold, a plurality of plungers, and a plunger block. The mold is prepared to mold a plurality of semiconductor devices. The plurality of plungers are plunged into the mold to inject a molding compound that will encapsulate the semiconductor devices in the mold. The plurality of plungers are assembled with the plunge block to operate at the same time. Each of the plurality of plungers includes a load sensor and/or a contact sensor, so as to sense separately whether the plungers are improperly operating.

16 Claims, 9 Drawing Sheets

APPARATUS AND METHOD FOR MOLDING SIMULTANEOUSLY A PLURALITY OF SEMICONDUCTOR DEVICES

BACKGROUND OF THE INVENTION

1. Field of the Invention

The present invention relates to the field of semiconductor devices, and more particularly, to a molding apparatus and method by which, when a molding compound is injected into a mold to encapsulate simultaneously a plurality of semiconductor devices, abnormal operation of the molding apparatus is detected.

2. Discussion of Related Art

In assembling semiconductor devices, a molding process encapsulates semiconductor devices using a molding compound such as epoxy molding compound (hereinafter "EMC") to mold the semiconductor devices into packages. Preferably, prior to the molding process, a lead connection process bonds the semiconductor devices to a lead frame. This molding process is performed in a mass-production process to mold a large number of semiconductor devices at the same time by an automatic molding apparatus. Generally, the molding of a large number of semiconductor devices bonded to a lead frame is automatically repeated.

To mold a large number of semiconductor devices, a molding apparatus includes a plunger block or a plunger unit having a plurality of plungers. The plunger block generally includes about 10 plungers or less. The plungers are plunged into a mold to inject a molding compound into the mold. Here, the individual plungers move along with the movement of the plunger block so as to inject the molding compound into the mold.

When the plungers ascend from below the mold into the mold to inject the molding compound into the mold, the plungers in the plunger block ascend not separately but simultaneously with the ascent of the plunger block. With the application of such a plunger block type press, uniform pressure can be applied when molding a plurality of semiconductor devices at the same time.

However, when occasionally one or more of the plungers does not operate properly, such as a plunger does not completely ascend even though the plunger block completely ascends, the molding compound will not be completely injected into the mold, and thus the molding of a semiconductor device corresponding to the specific plunger may be incomplete. Further, if the ascent of the specific plunger is incomplete, excessive pressure may be applied on the specific plunger and further molding failures occur.

FIG. 1 is a cross-sectional view of a molding apparatus in which semiconductor devices are normally molded. FIG. 2 is a cross-sectional view of a molding apparatus in which semiconductor devices are incompletely molded.

Referring to FIG. 1, as a plunger block (not shown) ascends, a plunger 10 ascends into a plunger hole 27 formed into a mold 20. A molding compound 40, e.g., epoxy molding compound (EMC), which is placed on the plunger 10 and being melted into liquid, flows into molding cavities 25 in the mold 20 due to pressure generated by the ascent of the plunger 10. Here, the plunger 10 ascends with a predetermined pressure to inject the molding compound 40. The molding cavities 25 are formed in a predetermined shape between a lower mold 21 and an upper mold 23 to form molding products or packages 50 in a predetermined shape. The molding compound 40 is injected where a lead frame 30, to which semiconductor devices are bonded by a lead connection process, is installed in the molding cavities 25.

When the plunger 10 ascends completely, the liquid molding compound 40 smoothly flows into the molding cavities 25 and completely fills the molding cavities 25. Thereafter, the molding compound 40 is fully solidified to complete the molding products 50. Next, the plunger 10 descends, the lower and upper molds 21 and 23 are separated from each other, and the molding products 50 are taken away.

To normally complete the molding products 50, the plunger 10 must smoothly and completely ascend into and descend out of the mold 20 along with the plunger block. However, although the plunger block normally ascends, there is a case where one or more plunger in the plunger block may not normally ascend for several reasons.

Referring to FIG. 2, if a plunger 15 in a plunger block does not normally ascend into a mold 20 even in a case where the plunger block normally ascends, the molding compound 40 cannot smoothly and fully flow into molding cavities 25 in the mold 20 because the plunger 15 fails to apply full pressure to a molding compound 40. As a result, the molding cavities 25 are not completely filled with the molding compound 40 and molding products 55 are poorly completed. For example, semiconductor devices 31, which are placed on and electrically connected to a lead frame 30 by bonding wires 33, are incompletely encapsulated.

Such poor molding occurs mainly when the plunger 15 does not normally ascend due to abnormal friction with the sidewall of a plunger hole 27 even though the plunger block normally ascends. Then, the plunger 15 stops ascending, and thus incomplete injection or incomplete molding occurs.

The stopping or abnormal operation of the plunger block can be sensed or detected when all of the plungers or a great majority of plungers in the plunger block simultaneously stop or abnormally operate. However, the abnormal operation of a small number of plungers in the plunger block does not greatly affect the movement of the plunger block, and thus the abnormal operation may not be detected. In other words, in a plunger block type press, since the movement of the plunger block causes the plungers to move together, there may be a certain specific plunger operating abnormally even when the plunger block moves normally. Thus, it is difficult to individually sense the abnormal operations of certain specific plungers.

Since semiconductor devices molding is continuously repeated in an automatic molding apparatus for mass-producing semiconductor devices, if the abnormal operations of specific plungers cannot be detected, a large number of molding may be poor. In particular, as chip sizes of semiconductor devices become smaller, a plurality of molding cavities (25 of FIG. 1) are designed to correspond to one plunger (10 of FIG. 1) to improve productivity. Thus, if the abnormal operation of the plunger 10 is not sensed quickly or in real-time, a large number of poorly molded semiconductor devices may result. Also, if the abnormal operation of the specific plunger continues, not only will semiconductor devices be poorly molded, but the abnormal operation will also spread over the mold to perhaps the entire automatic molding apparatus.

Therefore, a method or a molding apparatus is needed by which molding products can be efficiently prevented from being poorly manufactured, by separately detecting the abnormal operations of individual plungers in real-time during a molding process.

SUMMARY OF THE INVENTION

The present invention is directed to an apparatus for molding a plurality of semiconductor devices at the same time. According to a preferred embodiment of the present invention, when a plurality of plungers in a plunger block ascend into a mold with the ascent of the plunger block so as to apply pressure to a molding compound, abnormal operations of certain specific plungers are separately sensed to prevent the semiconductor devices from being poorly molded repeatedly, thereby efficiently enhancing productivity of molding a large number of semiconductor devices.

According to a preferred embodiment of the present invention, there is provided a molding apparatus for molding semiconductor devices that are wire-bonded to a lead frame. The molding apparatus includes a mold, a plurality of plungers, a plurality of sensors, and a plunger block. The mold is used to mold a plurality of semiconductor devices. The plurality of plungers are plunged into the mold to inject a molding compound that will encapsulate the semiconductor devices in the mold. The plurality of sensors are installed under the respective plungers to sense whether the plungers operate abnormally. The plurality of plungers are assembled with the plunger block to operate at the same time.

Here, the plunger block is positioned under the mold so that the plurality of plungers move from below the mold into the mold, and is operated to move up and down so that the plungers move up and down.

According to another embodiment, a molding apparatus may include a mold, a plurality of plungers, a plunger block, and a plurality of load sensors. The mold is used to mold a plurality of semiconductor devices. The plurality of plungers are plunged into the mold to inject a molding compound that will encapsulate the semiconductor devices in the mold. The plurality of plungers are assembled with the plunger block to operate at the same time. The plurality of load sensors are installed at respective plungers to sense pressures that are generated when the respective plungers operate.

The molding apparatus may further include plungers each of which has a plunger protrusion, a limit bar which limits movement of the plungers to a predetermined extent that prevents the plungers from deviating from the plunger block, and a plurality of contact sensors which sense whether each plunger protrusion of the plungers contacts the limit bar along with normal operation of the plungers.

Here, the plunger block is positioned under the mold so that the plurality of plungers move from below the mold into the mold, and moves up and down so that the plungers ascend and descend. The limit bar allows the plungers to ascend into the mold as far as they can go so as to inject the molding compound into the mold, contacts plunger protrusions of the plungers when the plunger block starts to descend, and causes the plungers to descend along with the continuous descent of the plunger block.

Here, the contact sensors may be installed at contact positions between the limit bar and the plunger protrusions of the plungers to contact the plunger protrusions of the plungers when the plungers start normally descending. If one of the contact sensors does not contact a plunger protrusion of a corresponding plunger when the plungers start normally descending, the contact sensor senses that the corresponding plunger is operating abnormally.

The limit bar may contact the plunger protrusions of the plungers while the plunger block waits to ascend so that the contact sensors contact the plunger protrusions of the plunger. Also, the limit bar is separated from the plunger protrusions of the plungers when the plungers are ascending along with the ascension of the plunger block so that the contact sensors separate from the plunger protrusions of the plungers.

According to embodiments of the present invention, when a plurality of plungers in a plunger block are moved into a mold by moving the plunger block to apply pressure to a molding compound, the abnormal operation of a specific plunger can be detected by separately sensing the abnormal operations of the plungers. Thus, the continuous repetition of poor molding due to an abnormal operation of a specific plunger can be prevented during a molding process. As a result, poor molding products can be efficiently prevented from being mass-produced.

These and other aspects and features of the present invention will be described or become apparent from the following detailed description of preferred embodiments, which is to be read in connection with the accompanying drawings.

DETAILED DESCRIPTION OF PREFERRED EMBODIMENTS

Figure 1:
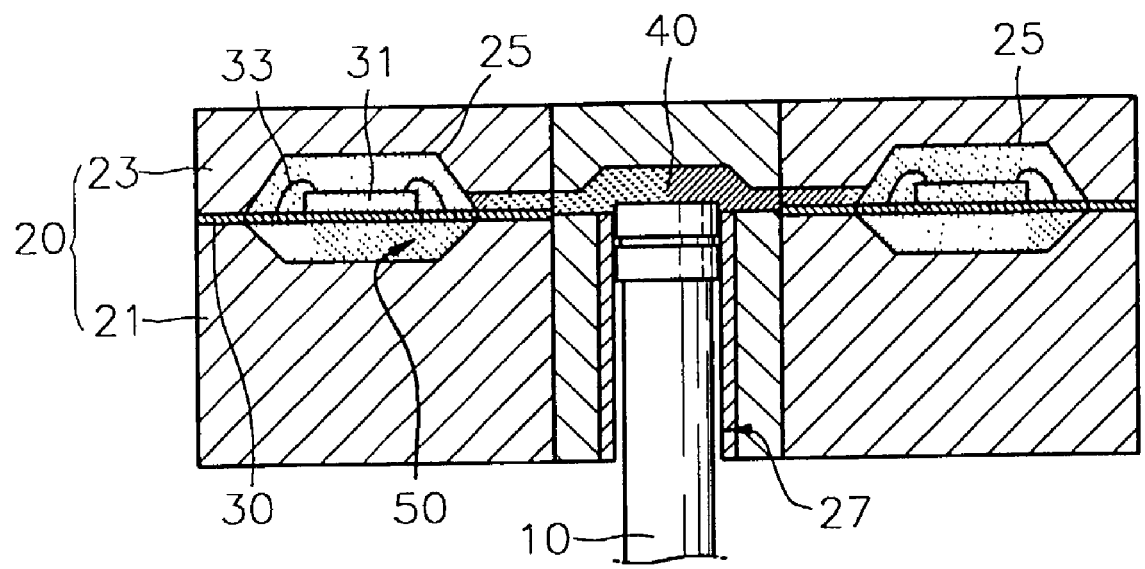
FIG. 1 is a cross-sectional view of a conventional molding apparatus by which semiconductor devices are molded.
Figure 2:
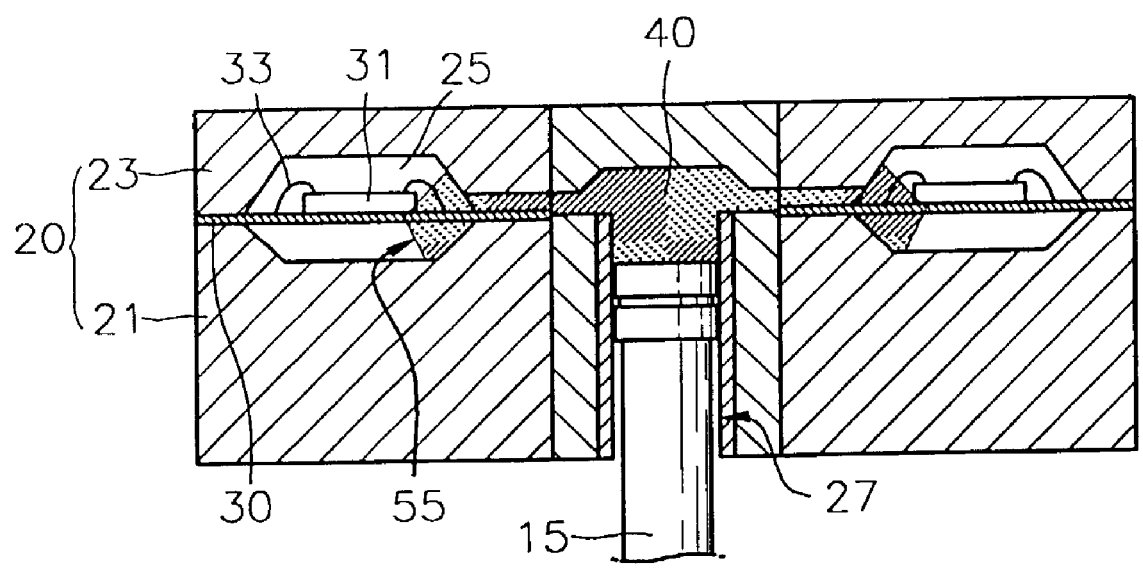
FIG. 2 is a cross-sectional view of a conventional molding apparatus when semiconductor devices are improperly molded.

Preferred embodiments of the present invention, hereinafter, will be described in detail with reference to the attached drawings. In the drawings, the thicknesses of layers or regions are exaggerated for clarity. Like reference numerals in the drawings denote the same members.

According to an embodiment of the present invention, there is provided an apparatus for molding semiconductor devices, which is configured to inject a molding compound into a mold based on pressure generated by individual plungers ascending along with the ascent of a plunger block including the plurality of plungers. Preferably, the molding apparatus may be an automatic molding apparatus in which a molding process is automatically repeated to mold a large number of semiconductor devices.

According to another embodiment of the present invention, there is provided a molding apparatus, in which a plurality of plungers ascend from below a mold into the mold and inject a molding compound to encapsulate the semiconductor devices in the mold. It is to be noted, however, that the plungers may move in other directions depending on the structure of the molding apparatus.

Detecting units according to preferred embodiments of the present invention are provided for sensing the abnormal operation of a specific plunger in a plunger block when the plunger block ascends. The detecting units can detect the abnormal operation of the specific plunger in real-time to prevent a large number of semiconductor devices from being incompletely molded.

Figure 3:
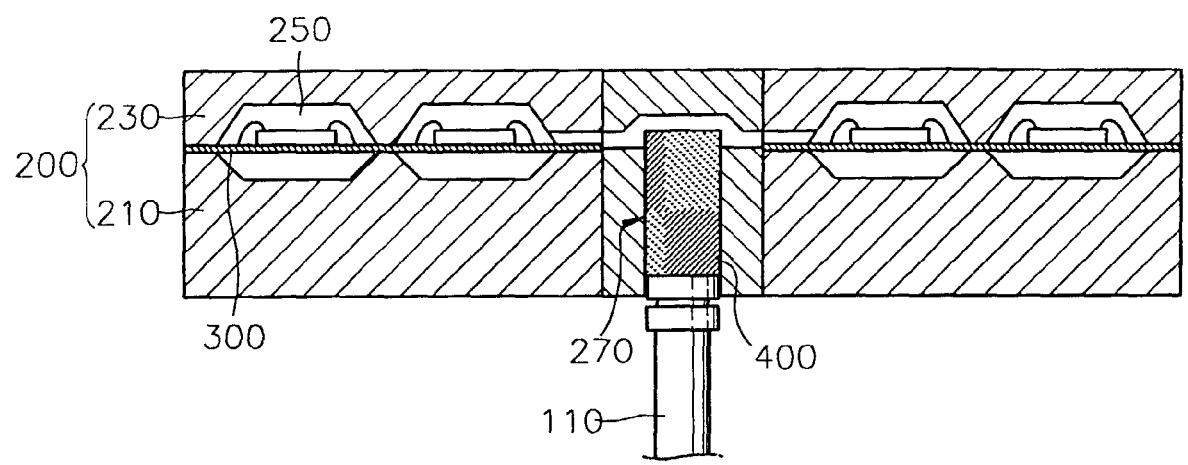
FIG. 3 is a cross-sectional view of a mold and a plunger used in a molding apparatus according to an embodiment of the present invention.
Figure 4:
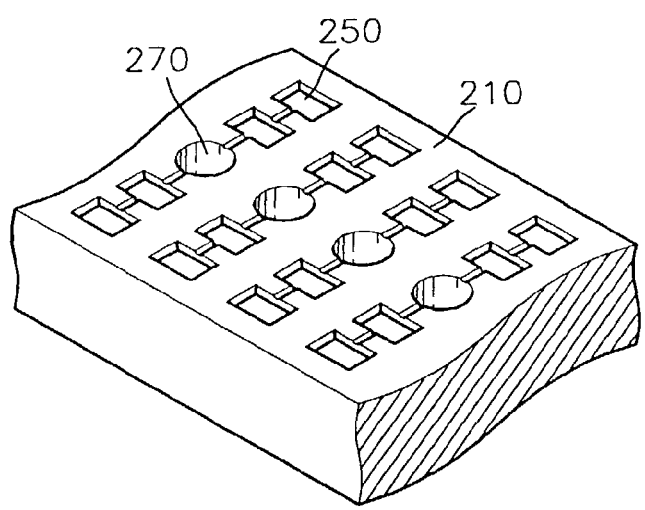
FIG. 4 is a perspective view of a lower mold used in a molding apparatus according to an embodiment of the present invention.

FIG. 3 is a cross-sectional view for explaining operations of a mold 200 and a plunger 110 used in a molding apparatus according to an embodiment of the present invention. FIG. 4 is a perspective view for explaining the mold used in the molding apparatus according to the embodiment of the present invention.

Referring to FIGS. 3 and 4, the mold 200, which is used in a process of packaging, in particular, molding semiconductor devices, includes a lower mold 210 and an upper mold 230. The lower mold 210 faces the upper mold 230 to form molding cavities 250. A lead frame 300, which supports wire-bonded semiconductor devices, is installed in the molding cavities 250.

Since a plurality, for example, several tens, of molding cavities 250 are included in one mold 200, a lead frame strip, to which a plurality of semiconductor devices are wire-bonded, is positioned between the lower and upper molds 210 and 230. Here, the semiconductor devices are arranged to position in the molding cavities 250 of the mold 200.

A plunger 110 ascends and is plunged into a plunger hole 270 to apply pressure to a molding compound 400 and to inject the molding compound 400, e.g., EMC, into the molding cavities 250 of the mold. A plurality of plunger holes 270 are configured in the mold 200 to allow a plurality of plungers 110 to move back and forth in the mold 200 along with the movement of a plunger block. The plunger holes 270 are formed in the lower mold 210 as shown in FIG. 4 to allow the plungers 110 to ascend and perform the injection process. As shown in FIG. 4, a plurality of molding cavities 250 may be connected to one plunger hole 270 to mass-produce semiconductor device packages.

The molding apparatus is automated to mass-produce molding products. The automatic molding apparatus repeats the processes of mounting a lead frame strip in a mold, injecting an EMC into the mold and hardening the EMC. The structures of the mold 200 and the plunger 110 shown in FIGS. 3 and 4 may be applied to an automatic molding apparatus. The automatic molding apparatus also includes an in-magazine part (not shown) in which semi-manufactured lead frames are stacked to automatically provide the semi-manufactured lead frames to the mold 200. The automatic molding apparatus further includes a tablet part which supplies a tablet compound to molding facilities. The automatic molding apparatus also includes a loader part which supplies the stacked lead frames or the molding compound, i.e., an EMC tablet, to the mold. The automatic molding apparatus further includes an unloader part which unloads packaged molding products from the mold and a stack part which stacks the packaged molding products.

Figure 5:
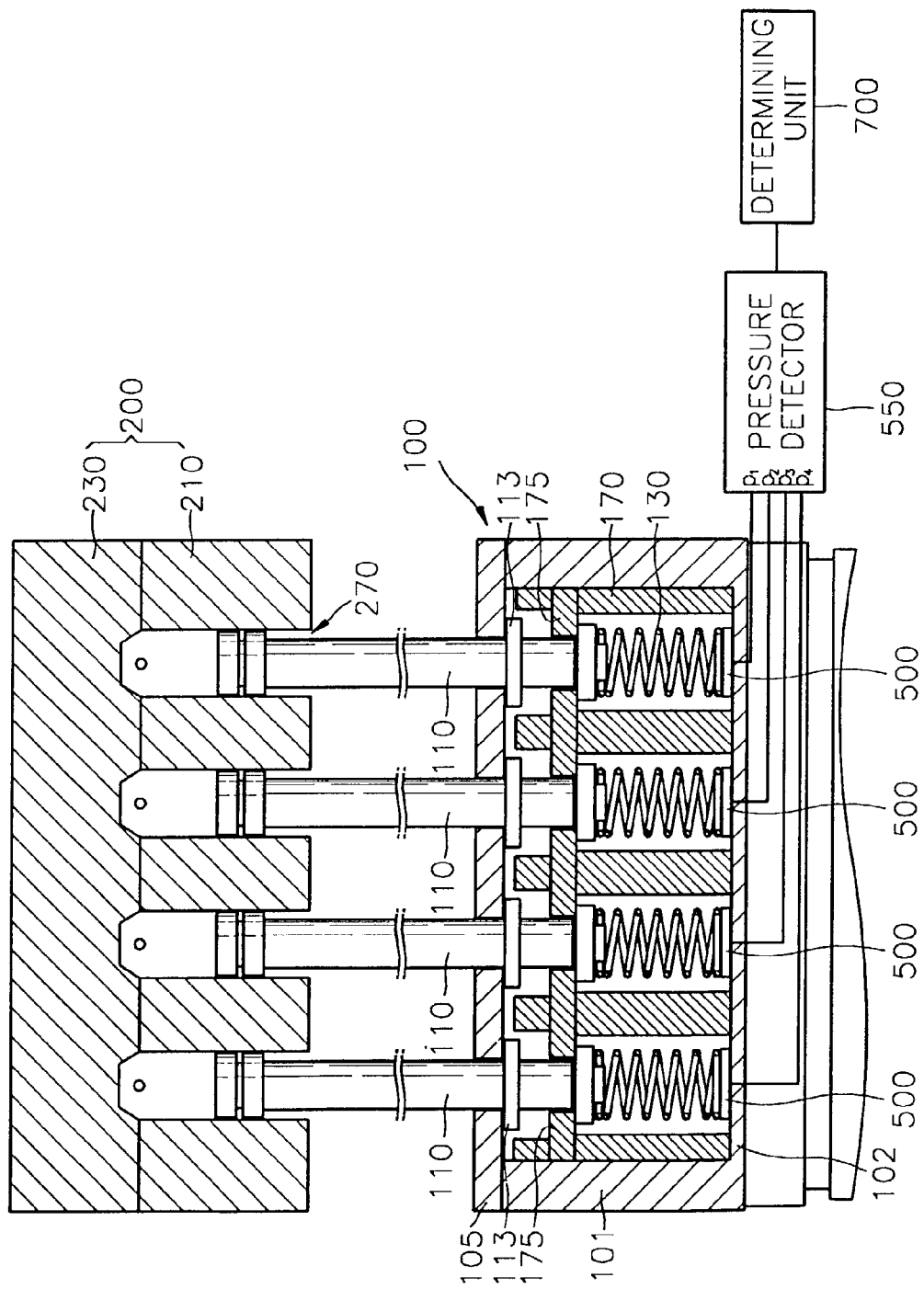
FIG. 5 is a cross-sectional view of a molding apparatus according to an embodiment of the present invention.

FIG. 5 is a cross-sectional view for explaining structure of a molding apparatus according to one embodiment of the present invention. Referring to FIG. 5, as described with reference to FIGS. 3 and 4, the plunger block 100 includes a plurality of plungers 110 which are arranged to plunge into a plurality of plunger holes 270 in a mold 200, respectively. In FIG. 5, one plunger block 100 includes four plungers 110, but a certain plunger block may include more than four plungers 110.

The plungers 110 are supported by a plunger block housing 101. Buffer supports 130 are placed beneath the plungers 110, respectively, so that the plungers 110 are supported by the bottom surface of the plunger block housing 101. Here, the plungers 110 are just placed on the buffer supports 130. Also, some other interconnecting parts may be incorporated between the plungers 110 and the buffer supports 130. The buffer supports 130 uniformly distribute and maintain pressure generated when the plungers 110 ascend along with the movement of the plunger block 100. Thus, the buffer supports 130 may include elastic members such as compression springs.

Separators 170 separate the plungers 110 from one another in the plunger block housing 101. A lower limit part 175 may be assembled at the upper end of a separator 170 and over the buffer supports 130 to limit the heights of the buffer supports 130 so that the plungers 110 are supported by the buffer supports 130 in a predetermined starting position.

The plunger block housing 101 includes the buffer supports 130. A limit bar 105 is joined with the upper position of the plunger block housing 101. Each of the plungers 110 includes plunger protrusion 113 for limiting travel of corresponding plunger 110 at the limit bar 105. The plunger protrusions 113 and the limit bar 105 also prevent the individual plungers 110 from deviating from the plunger block housing 101. The limit bar 105 serves to transfer a force from the plunger block 100 to the plungers 110 when the plunger block 100 descends after the plungers 110 ascend.

Load sensors 500 are placed between the buffer supports 130 and the bottom surface of the plunger block housing 101. A load sensor 500 is installed under each of the plungers 110 to support the buffer supports 130. Each of the load sensors 500 detects loads applied to a corresponding plunger 110, senses load pressures generated during the operations of the corresponding plunger 110, and transmits the sensed pressures to a pressure detector 550.

The pressure detector 550 transmits the numerical values of the pressures to a determining unit 700. The determining unit 700 determines the numerical values of the pressures applied to the plungers 110 to determine whether the plungers 110 operate normally. For example, assuming that the numerical values of the pressures detected by the load sensors of the plungers 110 are $P_1$, $P_2$, $P_3$, and $P_4$, and a normal pressure applied when the plungers 110 operate normally is P, the determining unit 700 compares the numerical values $P_1$, $P_2$, $P_3$, and $P_4$ with the pressure P to determine whether there is an abnormal pressure. In one embodiment, the determining unit 700 determines how much the numerical values obtained from the plungers deviate from the normal pressure P. The determining unit 700 warns a user about any abnormal pressures and informs the user as to which plunger is generating an abnormal pressure.

As described above, by installing a load sensor 500 under each of the plungers 110, a specific plunger that generates an abnormal pressure during the molding process can be sensed in real-time. As a result, when a specific plunger 110 operating abnormally is detected, the molding process can be stopped and poorly molded products are not mass produced.

Figure 6:
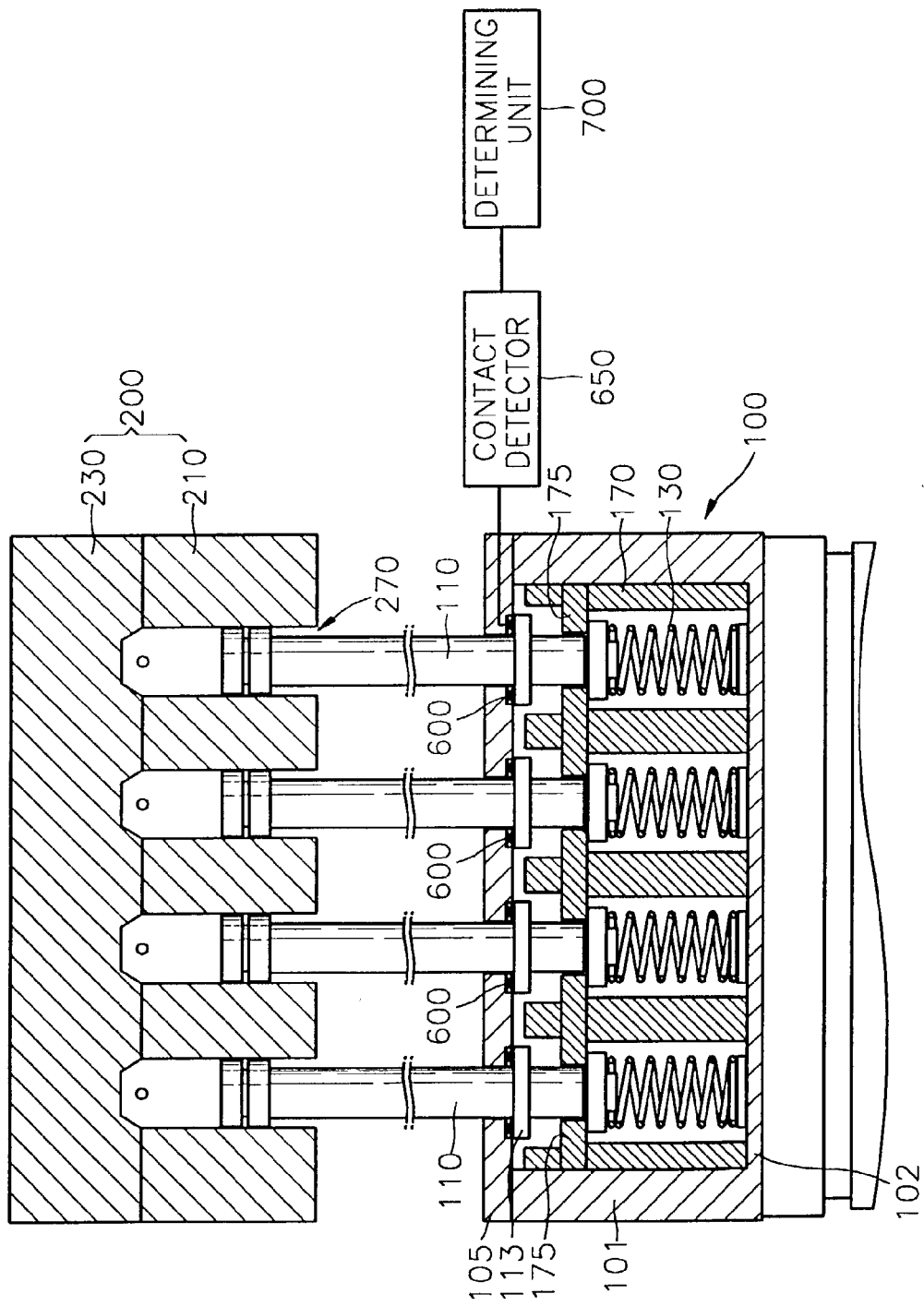
FIG. 6 is a cross-sectional view of a molding apparatus according to an embodiment of the present invention.

FIG. 6 is a cross-sectional view of a molding apparatus according to another embodiment of the present invention. Referring to FIG. 6, a touch sensor 600 is installed between each of plunger protrusions 113 and a limit bar 105. Touch sensors 600 sense whether the plunger protrusions 113 contact or touch touch sensors 600, respectively. For example, each of the touch sensors 600 may include electrical circuits (not shown), which are constituted to apply currents to the circuits only when the plunger protrusions 113 contact or touch the touch sensors 600. Signals of the touch sensors 600 are transmitted to a contact detector 650. The determining unit 700 analyses the signals, determines whether the plungers 110 are operating abnormally, and informs a user as to whether the respective plungers 110 are operating normally or abnormally.

Assuming that the plungers 110 are operating normally during a molding process, the plungers 110 ascend, and after the molding process is completed, the plungers 110 are positioned in an initial descending position. However, if the plungers 110 are operating abnormally, the plungers 110 fail to position in the initial descending position even though the molding process is completed. In more detail, a molding compound 400 is injected after the plunger block 100 completely ascends, and the plunger block 100 descends after the molding process is completed in the normal process.

At the initial stage of descent of the plunger block 100, the plunger block starts moving down while the plungers 110 maintain their positions when the molding process is just completed. In other words, the plungers 110 maintain their positions at the maximum ascent height. Thus, at the early stage of the descension of the plunger block and the plungers, the plunger block 100 first descends. Since the plunger block 100 descends and the plungers 110 maintain their positions, the plunger protrusions 113 of the plungers 110 contact the limit bar 105 as the plunger block descends in case the plungers 110 operate normally. In this case, the plunger protrusions 113 contact the touch sensors 600.

A specific one of the plungers 110 corresponding to one of the plunger protrusions 113 that does not contact the one of the touch sensors 600 at the early stage of descension may be regarded as operating abnormally during the molding process. Since the specific one of the plungers 110, which abnormally ascended, is lower than the other plungers 110, the plunger protrusion 113 of the specific plunger 110 does not contact a corresponding contact sensor 600 while each of the other plunger protrusions 113 normally contacts each of corresponding touch sensors 600, respectively. Since the touch sensors 600 sense whether the plunger protrusions 113 contact the touch sensors 600, the touch sensors 600 can sense whether the respective plungers 100 operate abnormally.

Figure 7:
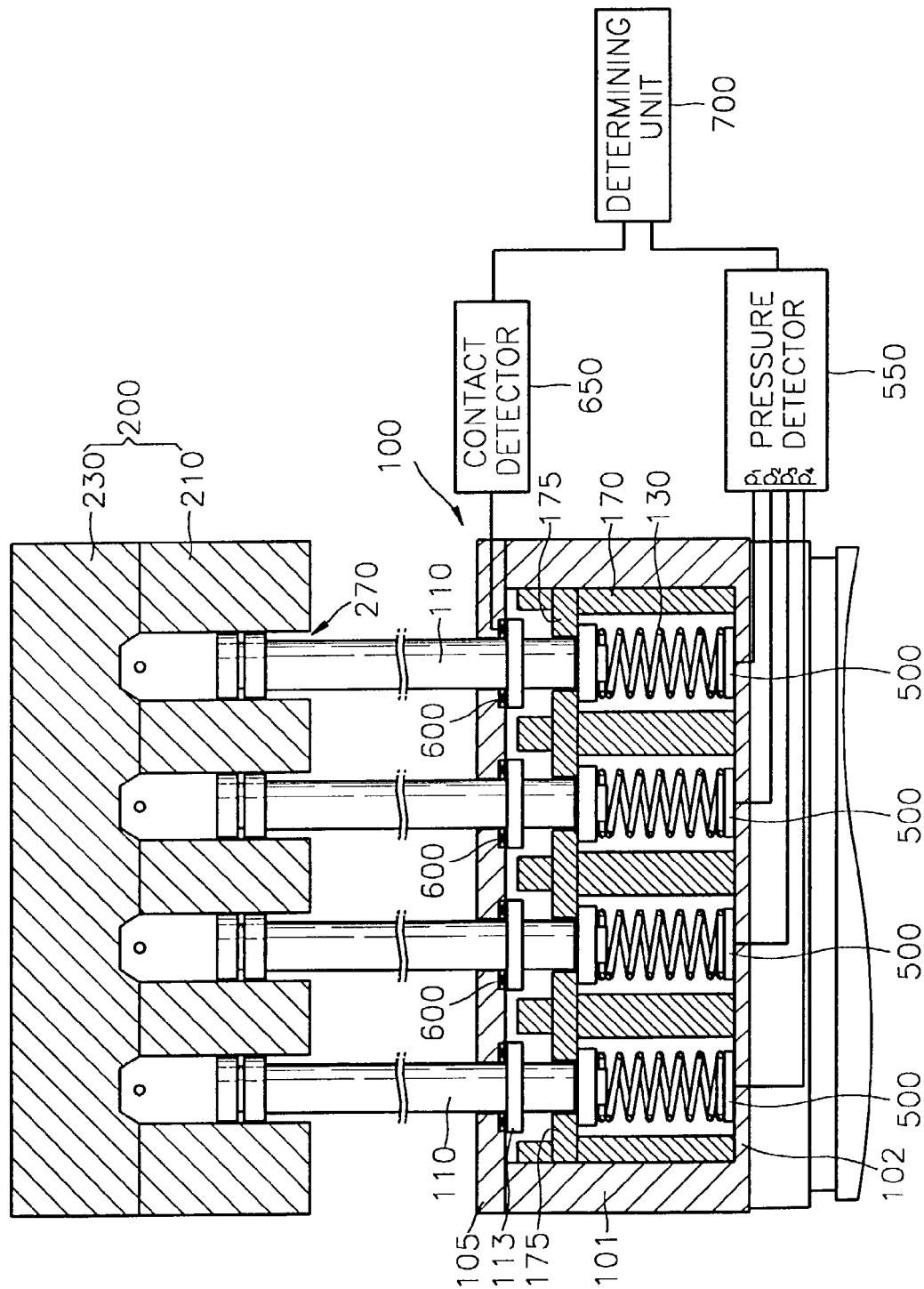
FIG. 7 is a cross-sectional view of a molding apparatus according to an embodiment of the present invention.

FIG. 7 is a cross-sectional view for explaining a molding apparatus according to another embodiment of the present invention. Referring to FIG. 7, it can be precisely sensed whether plungers 110 operate abnormally by combining methods described above with reference to FIGS. 5 and 6.

Preferably, touch sensors 600 are installed between plunger protrusions 113 of the plungers 110 and a limit bar 105. The touch sensors 600 sense whether the plunger protrusions 113 contact the touch sensors 600 and transmit contact or non-contact signals to a contact detector 650. The contact detector 650 transmits the contact or non-contact signals to a determining unit 700.

Load sensors 500 are installed under the plungers 110 between buffer supports 130 and the bottom 102 of a plunger block housing 101, respectively. The load sensors 500 detect loads or pressures that are applied to the respective plungers 110 corresponding to the load sensors 500, sense load pressures generated during the operations of the plungers 110, and transmit signals of the load pressures to a pressure detector 550. The pressure detector 550 detects pressure values from the load sensors 500 and transmits the pressure values to the determining unit 700.

The determining unit 700 determines whether the plungers 110 operate normally based on the pressure values and the contact or non-contact signals. In case the abnormal operation of a specific one of the plungers 110 is sensed due to an abnormal pressure, the determining unit 700 warns a user of the abnormal operation, and provides the user with information about the specific plunger 110.

By detecting whether the specific plunger 110 operates abnormally according to the methods described above, the reliability of sensing whether the specific plunger 110 operates abnormally can be effectively increased.

FIGS. 8 through 11 are cross-sectional views for explaining a process of detecting the abnormal operation of a specific plunger of the molding apparatus according to preferred embodiments of the present invention.

Figure 8:
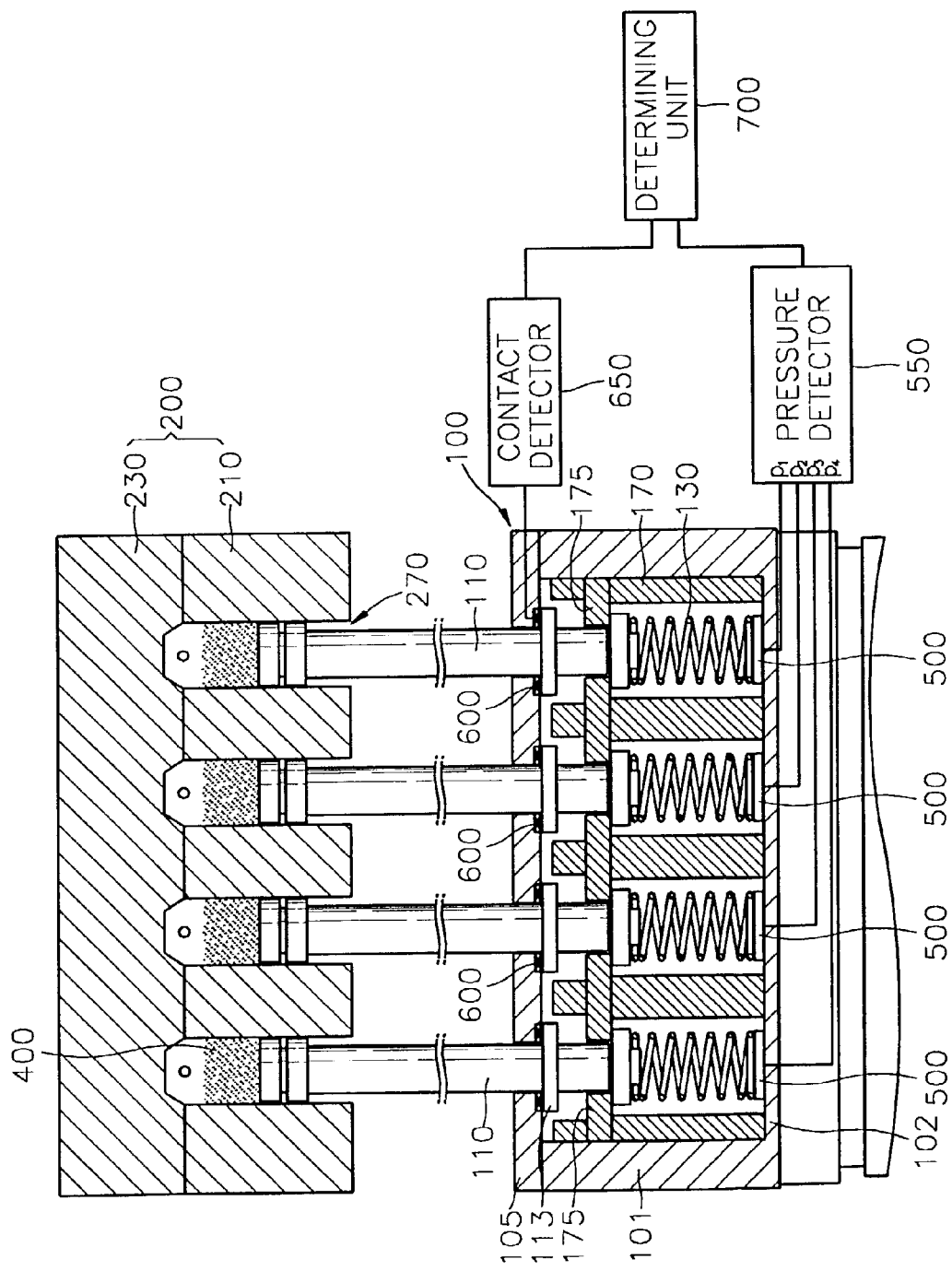
FIGS. 8 through 11 are cross-sectional views for illustrating a process of detecting an abnormal operation of a plunger in a molding apparatus according to preferred embodiments of the present invention.
Figure 9:
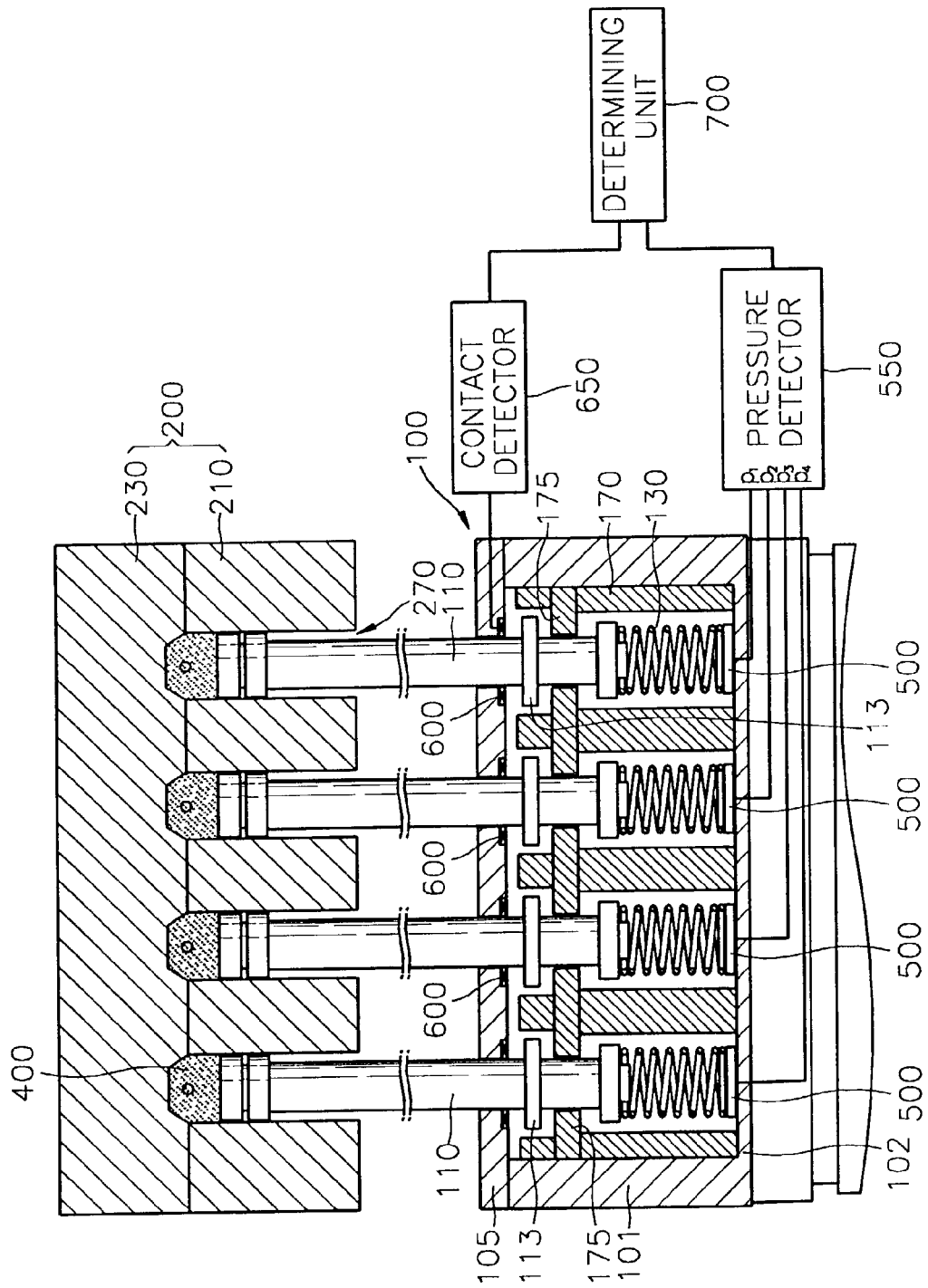
Figure 10:
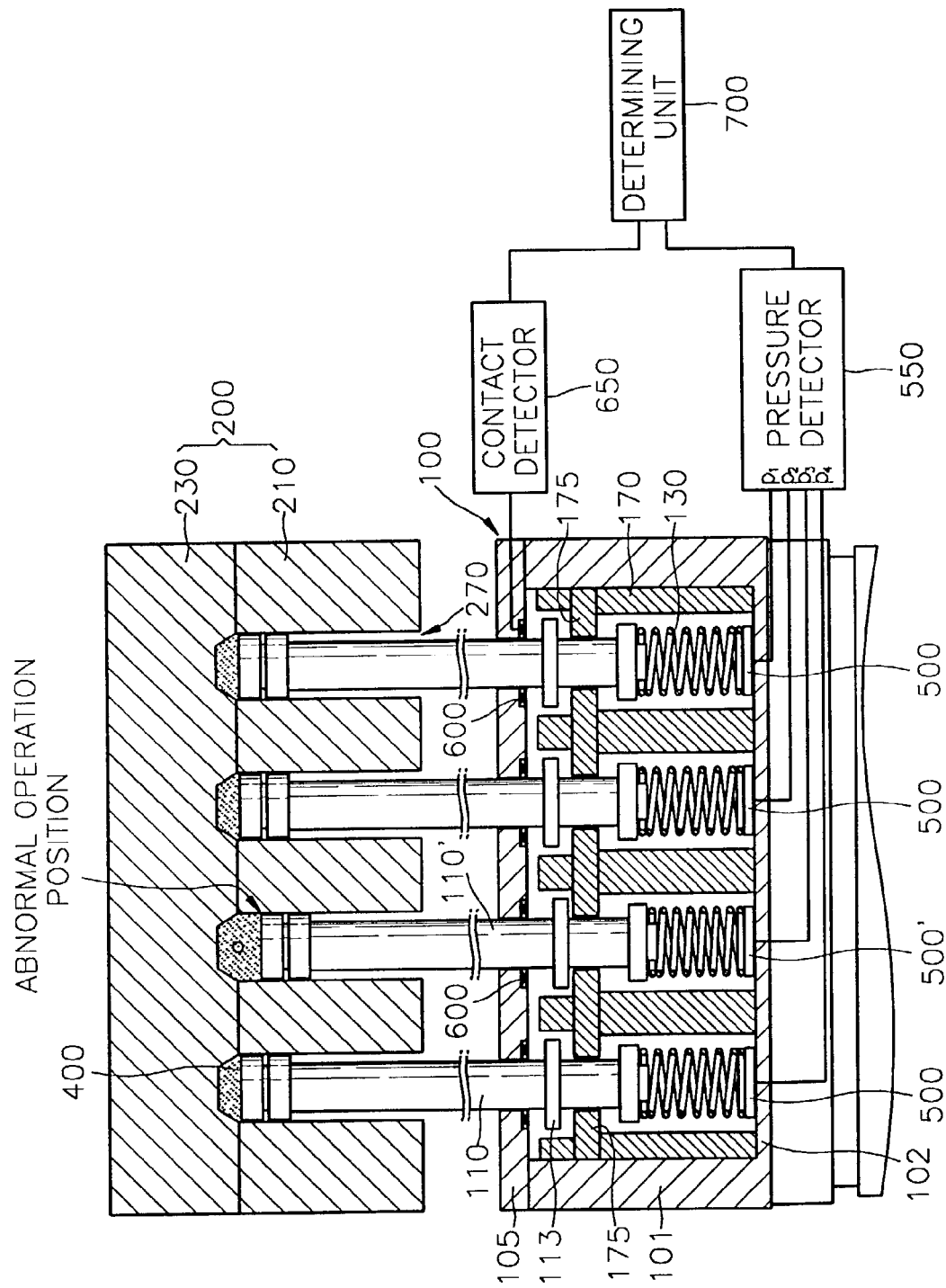
Figure 11:
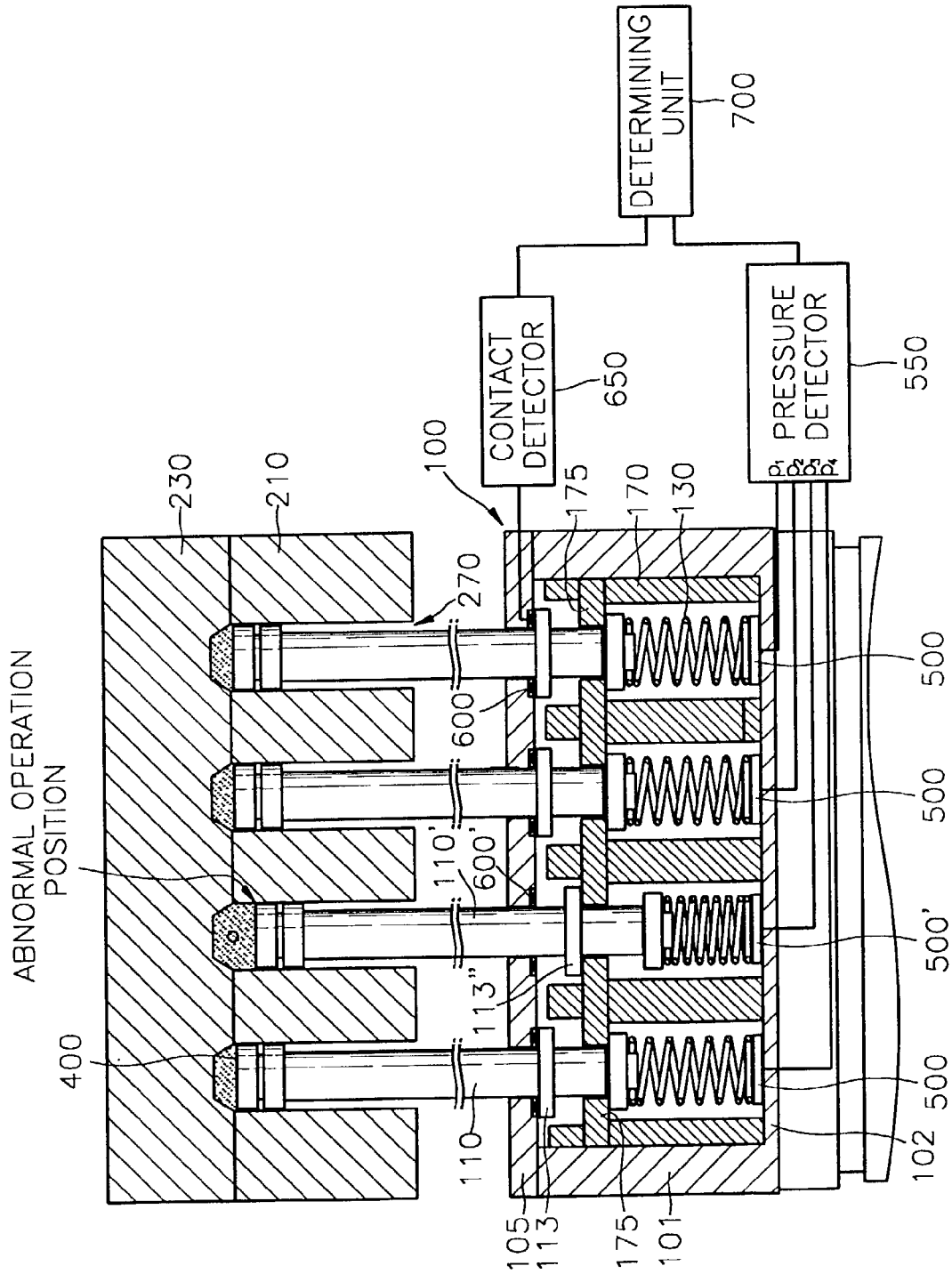

FIG. 8 is a cross-sectional view illustrating positions of plungers in the early molding stage. FIG. 9 is a cross-sectional view illustrating positions of plungers while the plungers ascending in a molding process. FIG. 10 is a cross-sectional view illustrating positions of plungers when the plungers complete ascending in the molding process. FIG. 11 is a cross-sectional view illustrating positions of plungers when the plungers start descending after the molding process is completed.

Referring to FIG. 8, a lead frame strip (not shown) onto which semiconductor devices are wire-bonded is installed between an upper mold 230 and a lower mold 210 to arrange the semiconductor devices in molding cavities (250 of FIG. 3). Plungers 110 are plunged into respective plunger holes 270 in the mold 230, and a molding compound 400, e.g., EMC, is melted into liquid on the ends of the plungers 110 and is injected into the mold 230. The processes of employing the lead frame strip and EMC are automatically performed in an automatic molding apparatus.

In the initial stage of the molding process, the plungers 110 are in the initial positions for molding. The plunger protrusions 113 of the plungers 110 contact the bottom of the limit bar 105 of the plunger block 100. Where touch sensors 600 are installed as in FIG. 6, the plunger protrusions 113 contact the touch sensors 600, and the touch sensors 600 signal a contact of the plunger protrusions 113 and the touch sensors 600 to a contact detector 650 and a determining unit 700. In the early molding stage, the plungers 110 in the plunger block 100, in a normal case, are all positioned to contact the touch sensors 600.

Referring to FIG. 9, when the molding compound 400, e.g., EMC, is fully changed to liquid for injection into the mold 200, plungers 110 in the plunger block 100 ascend along with the ascension of the plunger block 100. Plunger protrusions 113 are separated from the bottom of the limit bar 105 due to pressures generated when the plungers 110 ascend. If touch sensors 600 are installed (on the limit bar 105), the plunger protrusions 113 separate from the touch sensors 600.

Preferably, when the plunger block 100 ascends, i.e., the plungers 110 ascend, positions of buffer supports 130 and the ascension pressure of the plunger block 100 are controlled to position the plunger protrusions 113 between the limit bar 105 and a lower limiting part 175.

It is normal for the plungers 110 in the plunger block 100 to move smoothly up and down along with the movement of the plunger block 100. However, some specific plungers may operate abnormally due to reasons such as an increase in abnormal friction forces between the plungers 110 and plunger holes 270.

Referring to FIG. 10, when plungers 110 ascend to a predetermined maximum height with the completion of the ascent of the plunger block 100, the injection of EMC into a mold 200 is completely performed. Here, it is normal for the plungers 110 to ascend to their maximum heights. However, a specific plunger 110' operates abnormally due to a harmful cause such as a rise in abnormal friction force. In other words, the specific plunger 110' stops ascending in the middle of its ascent and thus does not reach its predetermined maximum height.

However, since the abnormal operations of a small minority of plungers do not greatly affect the operation of the plunger block 100, the plunger block 100 continues to ascend. Thus, the other normal plungers 110 continue to ascend to complete the injection of the EMC. Since the specific plunger 110' does not ascend, the injection of the related EMC is not completed.

Since the specific plunger 110' stops ascending, the specific plunger 110' is lower than the other normal plungers 110. Since the specific plunger 110' stops ascending while the plunger block 100 continues ascending, a high abnormal pressure is generated on the specific plunger 110', compared to pressures on the other normal plungers 110. A load sensor 500', which is positioned under the specific plunger 110', senses the abnormal pressure of the specific plunger 110' and transmits it to a pressure detector 550. A determining unit 700 compares the abnormal pressure signal detected from the specific plunger 110' with normal pressure signals detected from the other normal plungers 100 to determine whether the specific plunger 110' operates abnormally and signals the abnormal operation of the specific plunger 110' for the user.

Using an alarm system, it can be sensed in real-time whether the specific plunger 110' operates abnormally so as to quickly cope with the abnormal operation. Therefore, poorly molded products (or packages) due to repeated abnormal operation of the specific plunger 110' during an automatically repeated molding process can be prevented from being mass-produced.

Referring to FIG. 11, the plunger block 100 starts descending after the injection of a molding compound 400 and the completion of the molding. Here, the descending operation of the plunger block 100 makes touch sensors 600 contact with plunger protrusions 113 of normal plungers 110. Thus, the touch sensors 600 generate normal contact signals and transmit the normal contact signals to the contact detector 650. The determining unit 700 informs a user that the plungers 110 are operating normally, based on the normal contact signals.

Thereafter, as the plunger block 100 continues descending, the plungers 110 operate normally, continue to descend, and return to the initial position. The molding process is automatically repeated in an automatic molding apparatus.

However, since the specific plunger 110', which abnormally operates during its ascent, stops ascending, the specific plunger 110' is lower than the other normal plungers 110. Thus, a plunger protrusion 113" of the specific plunger 110' fails to make contact with a contact sensor 600' while the plunger protrusions 113 of the other normal plungers 110 make contact with the respective touch sensors 600, and generate contact signals. As a result, since the contact sensor 600' cannot provide a contact signal to the contact detector 650, the determining unit 700 warns a user of the abnormal operation.

As proposed in FIG. 7, with a combination of these two methods of sensing abnormal operations, an abnormal operation of a specific plunger 110' can be precisely sensed. Thus, the reliability of warning a user about the abnormal operation is increased.

When normal descending is performed, a plunger block 100 continues to descend. Thus, plungers 110 also continue to descend and return to their positions in the early molding stage as shown in FIG. 8. The molding process is automatically repeated in an automatic molding apparatus. If the abnormal operation of the specific plunger 110' is not sensed, poor molding is repeated due to the abnormal operation of the specific plunger 110'. However, as described in the present invention, since the abnormal operation of the specific plunger 110' can be efficiently and reliably sensed during the molding process, poorly molded products due to the repetition of poor molding can be prevented from being mass-produced.

According to preferred embodiments of the present invention, when a large number of semiconductor devices are packaged using a plunger block having a plurality of plungers in a molding apparatus, the abnormal operation of a specific plunger can be efficiently sensed when the plunger block is operating. Thus, when the molding process is automatically repeated, poorly molded products or packages due to the abnormal operation of the specific plunger can be prevented.

Although the invention has been described with reference to particular embodiments, the embodiments of the present invention can be modified into various other forms, and the scope of the present invention must not be interpreted as being restricted to the embodiments. It will be apparent to one of ordinary skill in the art that modifications of the described embodiments may be made without departing from the spirit and scope of the invention.

What is claimed is:

1. A molding apparatus comprising:
  a mold configured to mold simultaneously a plurality of semiconductor devices;
  a plurality of plungers for injecting a molding compound to encapsulate the semiconductor devices;
  a plunger block with which the plurality of plungers are assembled to operate at the same time; and
  a plurality of sensors for sensing whether the plungers operate improperly, each of the plurality of sensors being positioned between one end of a corresponding plunger and the bottom of the plunger block.

2. The molding apparatus of claim 1, wherein the plunger block is positioned under the mold so that the plurality of plungers move from below the mold into the mold, and moves up and down so that the plungers move up and down.

3. A molding apparatus comprising:
  a mold configured to mold simultaneously a plurality of semiconductor devices;
  a plurality of plungers having plunger protrusions for injecting a molding compound to encapsulate the semiconductor devices in the mold;
  a plunger block with which the plurality of plungers are assembled to operate at the same time;
  a limit bar for limiting movement of the plungers to a predetermined extent; and
  a plurality of contact sensors for respectively sensing whether respective plunger protrusions of the plungers contact the limit bar.

4. The molding apparatus of claim 3, wherein the plunger block is positioned under the mold;
  the plurality of plungers ascend from below the mold into the mold and inject the molding compound into the mold; and
  the limit bar limits the plungers to ascend at their maximum, contacts the plunger protrusions of the plungers with the descent of the plunger block, and causes the plungers to descend due to the continuous descent of the plunger block.

5. The molding apparatus of claim 4, wherein the contact sensors are disposed at contact positions between the limit bar and the plunger protrusions of the plungers so as to contact the plunger protrusions of the plungers when the plungers start descending.

6. The molding apparatus of claim 5, wherein if one of the contact sensors does not contact a plunger protrusion of a corresponding plunger when the plungers start descending, the contact sensor senses that the corresponding plunger is improperly operating.

7. The molding apparatus of claim 5, wherein the limit bar contacts the plunger protrusions of the plungers to cause the contact sensors to contact the plunger protrusions of the plunger while the plunger block waits to ascend.

8. The molding apparatus of claim 5, wherein the limit bar is separated from the plunger protrusions of the plungers when the plungers are ascending due to the ascension of the plunger block so that the contact sensors separate from the plunger protrusions of the plungers.

9. A molding apparatus comprising:
a mold configured to mold simultaneously a plurality of semiconductor devices;
a plurality of plungers having plunger protrusions for injecting a molding compound to encapsulate the semiconductor devices in the mold;
a plunger block with which the plurality of plungers are assembled to operate at the same time;
a limit bar for limiting movement of the plungers to a predetermined extent that prevents the plungers from deviating from the plunger block;
a plurality of load sensors configured to sense respective pressures that are generated when the plurality of plungers operate; and
a plurality of contact sensors configured to sense whether the respective plunger protrusions of the plurality of plungers contact the limit bar along with normal operation of the plungers.

10. The molding apparatus of claim 9, wherein the plunger block is positioned under the mold so that the plurality of plungers move from below the mold into the mold, and moves up and down so that the plungers ascend and descend.

11. The molding apparatus of claim 10, wherein the load sensors sense the respective pressures that are generated when the plungers ascend.

12. The molding apparatus of claim 10, wherein the limit bar limits the plungers to ascend with the plunger block into the mold at their maximum so as to inject the molding compound into the mold, contacts the plunger protrusions of the plungers with the descent of the plunger block, and causes the plungers to descend due to the continuous descent of the plunger block.

13. The molding apparatus of claim 12, wherein the contact sensors are disposed at contact positions between the limit bar and the plunger protrusions of the plungers to contact the plunger protrusions of the plungers when the plungers start descending.

14. The molding apparatus of claim 13, wherein if one of the contact sensors does not contact a plunger protrusion of a corresponding plunger when the plungers start descending, the contact sensor senses that the corresponding plunger is improperly operating.

15. The molding apparatus of claim 13, wherein the limit bar contacts the plunger protrusions of the plungers to cause the contact sensors to contact the plunger protrusions of the plunger while the plunger block waits to ascend.

16. The molding apparatus of claim 13, wherein the limit bar separates from the plunger protrusions of the plungers when the plungers are ascending due to the ascension of the plunger block so that the contact sensors separate from the plunger protrusions of the plungers.

* * * * *